United States Patent
Lee et al.

(10) Patent No.: US 10,903,298 B2
(45) Date of Patent: Jan. 26, 2021

(54) DISPLAY DEVICE

(71) Applicant: SAMSUNG DISPLAY CO., LTD., Yongin-si (KR)

(72) Inventors: Seungkyu Lee, Yongin-si (KR); Taehoon Kwon, Yongin-si (KR); Byungsun Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/799,101

(22) Filed: Feb. 24, 2020

(65) Prior Publication Data

US 2020/0194530 A1 Jun. 18, 2020

Related U.S. Application Data

(63) Continuation of application No. 16/107,381, filed on Aug. 21, 2018, now Pat. No. 10,573,703, which is a (Continued)

(30) Foreign Application Priority Data

May 11, 2016 (KR) .......................... 10-2016-0057803

(51) Int. Cl.
*H01L 29/08* (2006.01)
*H01L 27/32* (2006.01)
(Continued)

(52) U.S. Cl.
CPC ....... *H01L 27/3272* (2013.01); *G09G 3/3266* (2013.01); *G09G 3/3291* (2013.01);
(Continued)

(58) Field of Classification Search
CPC .............. H01L 27/327; H01L 27/3272; H01L 27/3262; H01L 27/3265; H01L 27/3276; G09G 3/3266; G09G 3/3291
See application file for complete search history.

(56) References Cited

U.S. PATENT DOCUMENTS 6,358,759 B1  3/2002  Hirabayashi
9,105,589 B2  8/2015  Bang
(Continued)

FOREIGN PATENT DOCUMENTS

KR  10-2014-0079093  6/2014
KR  10-2014-0092574  7/2014
(Continued)

*Primary Examiner* — Phuc T Dang
(74) *Attorney, Agent, or Firm* — F. Chau & Associates, LLC

(57) ABSTRACT

A display device includes: a plurality of pixels each including a driving thin film transistor and a storage capacitor, wherein each of the pixels further includes: a driving semiconductor layer including a driving channel region, a driving source region, and a driving drain region; a first electrode layer, a portion of the first electrode layer overlapping the driving channel region; a second electrode layer overlapping the first electrode layer; a node connection line having a first side connected to the first electrode layer: a pixel electrode overlapping the first electrode layer and the second electrode layer; and a shielding layer between the first electrode layer and the pixel electrode and overlapping the first electrode layer, the node connection line, and the pixel electrode.

20 Claims, 11 Drawing Sheets

US 10,903,298 B2
Page 2

Related U.S. Application Data continuation of application No. 15/372,774, filed on Dec. 8, 2016, now Pat. No. 10,062,743.

(51) Int. Cl.
*G09G 3/3266* (2016.01)
*G09G 3/3291* (2016.01)

(52) U.S. Cl.
CPC ...... *H01L 27/3262* (2013.01); *H01L 27/3265* (2013.01); *H01L 27/3276* (2013.01); *G09G 2320/045* (2013.01)

(56) References Cited

U.S. PATENT DOCUMENTS

| | | | |
|---|---|---|---|
| 10,062,743 B2 | 8/2018 | Lee et al. | |
| 10,573,703 B2* | 2/2020 | Lee | H01L 27/3265 |
| 2003/0132896 A1* | 7/2003 | Matsueda | H01L 33/08 |
| | | | 345/55 |
| 2005/0161830 A1 | 7/2005 | Iki | |
| 2008/0007492 A1 | 1/2008 | Koh et al. | |
| 2000/0261332 | 10/2009 | Shin et al. | |
| 2011/0114957 A1 | 5/2011 | Kim et al. | |
| 2011/0134621 A1 | 6/2011 | Saimen | |
| 2011/0141548 A1* | 6/2011 | Yang | G02B 26/005 |
| | | | 359/292 |
| 2014/0198136 A1 | 7/2014 | Lee | |
| 2014/0225075 A1* | 8/2014 | Zhan | H01L 29/78672 |
| | | | 257/40 |
| 2014/0239270 A1 | 8/2014 | Ko et al. | |
| 2014/0320545 A1 | 10/2014 | Jeon | |
| 2015/0034933 A1* | 2/2015 | Hong | H01L 21/47635 |
| | | | 257/40 |
| 2015/0060865 A1* | 3/2015 | Kubota | H01L 27/326 |
| | | | 257/71 |
| 2015/0207094 A1 | 7/2015 | Hwang | |
| 2015/0310801 A1* | 10/2015 | Lin | G09G 3/3225 |
| | | | 345/205 |
| 2016/0104758 A1 | 4/2016 | Kim | |
| 2016/0204172 A1 | 7/2016 | Park | |
| 2016/0380039 A1* | 12/2016 | Oh | H01L 27/3262 |
| | | | 257/40 |
| 2017/0330927 A1 | 11/2017 | Lee et al. | |
| 2019/0043937 A1 | 2/2019 | Lee et al. | |

FOREIGN PATENT DOCUMENTS

| | | |
|---|---|---|
| KR | 10-2014-0108023 | 9/2014 |
| KR | 10-2014-0127689 | 11/2014 |
| KR | 10-2015-0071319 | 6/2015 |

\* cited by examiner

DISPLAY DEVICE

CROSS-REFERENCE TO RELATED APPLICATIONS

This application is a continuation of U.S. patent application Ser. No. 16/107,381 filed on Aug. 21, 2018, now U.S. Pat. No. 10,573,703 issued on Feb. 25, 2020, which is a continuation of U.S. application Ser. No. 15/372,774, filed on Dec. 8, 2016 now U.S. Pat. No. 10,062,743 issued on Aug. 28, 2018, which claims priority under 35 U.S.C. § 119 to Korean Patent Application No. 10-2016-0057803, filed on May 11, 2016, in the Korean Intellectual Property Office, the disclosures of which are incorporated by reference herein in their entireties.

TECHNICAL FIELD

Exemplary embodiments of the present inventive concept relate to a display device.

DESCRIPTION OF THE RELATED ART

In general, a display device includes a display element (or light emitting element) and electronic devices for controlling an electric signal applied to the display element. The electronic devices may include a thin film transistor (TFT), a storage capacitor, and a plurality of wirings.

To accurately control an amount of light emitted from a display device, the number of TFTs electrically connected to a display element has increased. Consequently, the number of wirings for transferring an electric signal to the TFTs has also increased.

SUMMARY

According to an exemplary embodiment of the present inventive concept, a display device includes: a plurality of pixels each including a driving thin film transistor and a storage capacitor, wherein each of the pixels further includes: a driving semiconductor layer including a driving channel region, a driving source region, and a driving drain region; a first electrode layer, a portion of the first electrode layer overlapping the driving channel region; a second electrode layer overlapping the first electrode layer; a node connection line having a first side connected to the first electrode layer; a pixel electrode overlapping the first electrode layer; and a shielding layer between the first electrode layer and the pixel electrode, the shielding layer overlapping the first electrode layer, the node connection line, and the pixel electrode.

A constant voltage may be applied to the shielding layer.

A driving voltage may be applied to the shielding layer.

Each pixel may further include a driving voltage line below the shielding layer and above the second electrode layer and for supplying a driving voltage.

The display device may further include: an insulating layer between the driving voltage line and the shielding layer, the driving voltage line being connected to the shielding layer via a contact hole in the insulating layer.

The node connection line may be between the second electrode layer and the shielding layer.

The shielding layer may cover the entire node connection line.

The first electrode layer may include an island type electrode layer.

Each pixel may further include: a switching thin film transistor connected to a scan line and a data line; and a compensation thin film transistor configured to be turned on by a scan signal of the scan line and configured to diode-connect the driving thin film transistor, a second side of the node connection line is connected to the compensation thin film transistor.

Each pixel may further include: a compensation semiconductor layer including a compensation channel region, a compensation source region, and a compensation drain region; and a compensation gate electrode overlapping the compensation channel region, and one of the compensation source region and the compensation drain region that is electrically connected to one of the driving source region and the driving drain region.

The compensation gate electrode may include a first compensation gate electrode and a second compensation gate electrode above the compensation semiconductor layer, the first and second compensation gate electrodes being spaced apart from each other, and the shielding layer may cover a region of the compensation semiconductor layer that is exposed between the first and second compensation gate electrodes.

The one of the compensation source region and the compensation drain region does not overlap the shielding layer.

The other one of the compensation source region and the compensation drain region overlaps the shielding layer.

The other one of the compensation source region and the compensation drain region may be electrically connected to the first electrode layer.

Each pixel may further include: a switching gate electrode and a switching semiconductor layer respectively connected to a scan line and a data line, wherein the shielding layer may be above the first electrode layer, the second electrode layer, and the data lines and at least one insulating layer is disposed between the shielding layer and the first electrode layer, the second electrode layer, and the data line.

According to an exemplary embodiment of the present inventive concept, a display device includes: a plurality of pixels, wherein at least one of the pixels comprises: a first electrode layer overlapping a driving channel region of a driving transistor; a second electrode layer overlapping the first electrode layer; a node connection line connected to the first electrode layer; a pixel electrode overlapping the first and second electrode layers; and a shielding layer between the first electrode layer and the pixel electrode and overlapping the node connection line.

According to an exemplary embodiment of the present inventive concept, a display device includes: a plurality of pixels, wherein at least one of the pixels comprises: a first electrode layer overlapping a channel region of a first transistor; a second electrode layer overlapping the first electrode layer; a node connection line overlapping the first and second electrode layers and electrically connected to the first electrode layer and one of a source region and a drain region of a second transistor; a shielding layer overlapping the node connection line; and a pixel electrode overlapping the shielding layer.

The first electrode layer and the second electrode layer may form a storage capacitor.

The shielding layer may completely cover the node connection line.

The second transistor may be a dual-gate transistor.

BRIEF DESCRIPTION OF THE DRAWINGS

The above and/or other features of the present inventive concept will become more apparent by describing in detail exemplary embodiments thereof, with reference to the accompanying drawings in which.

DETAILED DESCRIPTION OF THE EMBODIMENTS

Figure 1:
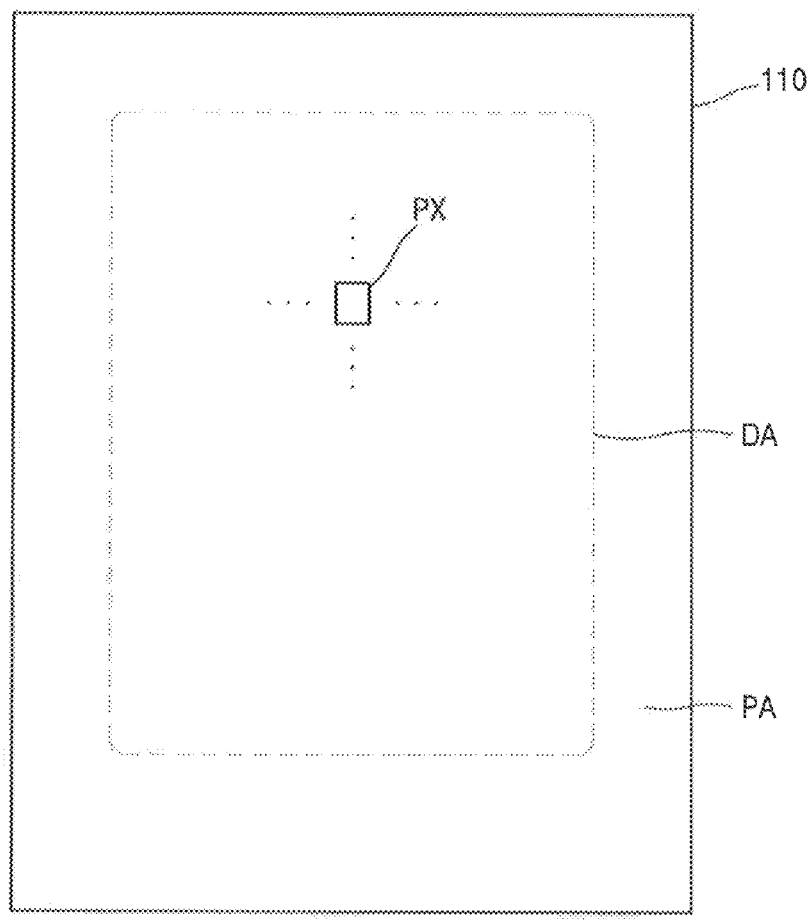
FIG. 1 is a plan view illustrating a display device according to an exemplary embodiment of the present inventive concept.
Figure 1:
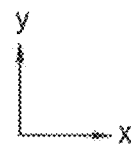

FIG. 1 is a plan view illustrating a display device according to an exemplary embodiment of the present inventive concept.

Referring to FIG. 1, the display device includes a substrate 110. The substrate 110 includes a display area DA and a peripheral area PA outside the display area DA. The peripheral area PA may surround the display area DA, for example.

Pixels PX including various display elements such as an organic light-emitting diode (OLED) may be in the display area DA. Various wirings for transferring an electric signal to be applied to the display area DA may be in the peripheral area PA. Hereinafter, for convenience of description, a display device including the OLED as a display element is described. However, exemplary embodiments of the present inventive concept are not limited thereto.

Figure 2:
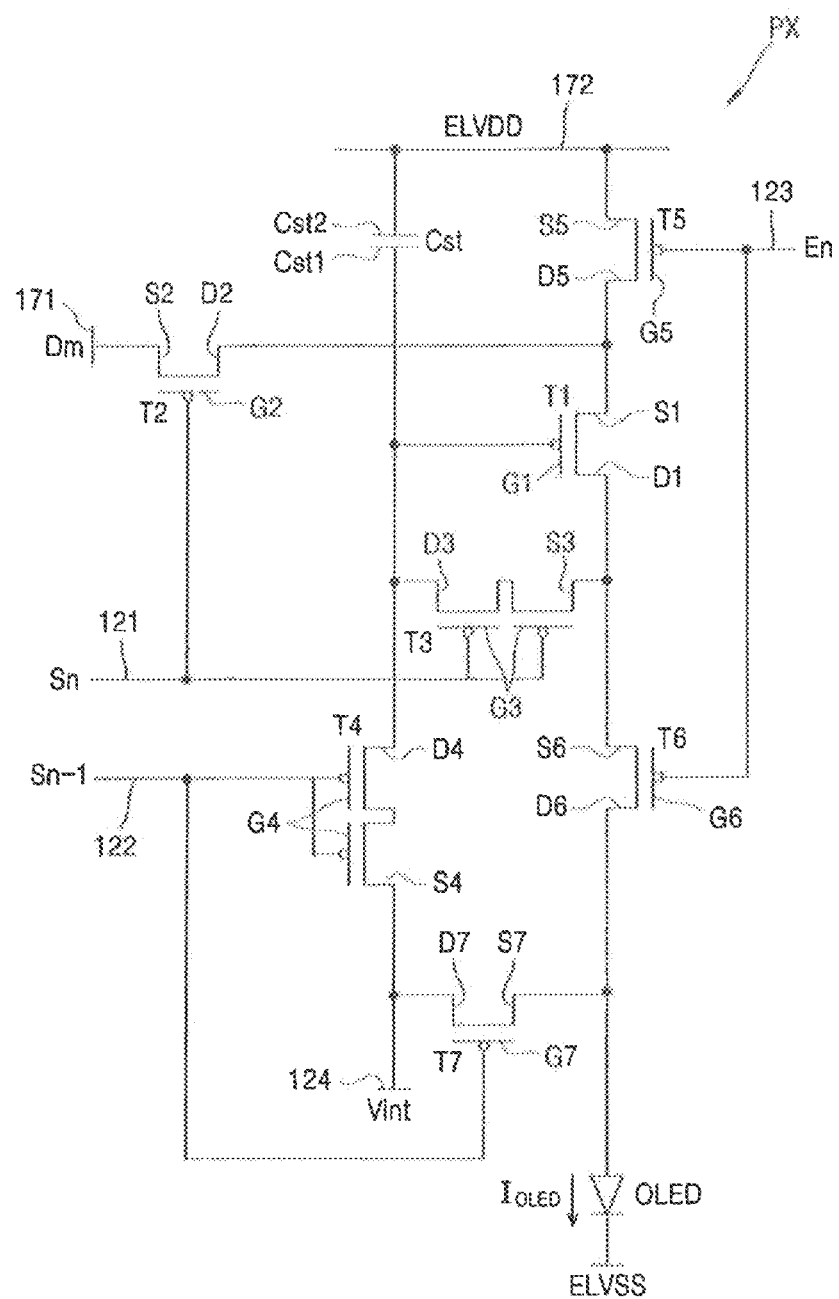
FIG. 2 is an equivalent circuit view of a pixel of the display device of FIG. 1 according to an exemplary embodiment of the present inventive concept.

FIG. 2 is an equivalent circuit view of a pixel of the display device of FIG. 1 according to an exemplary embodiment of the present inventive concept.

Referring to FIG. 2, a pixel PX includes signal lines 121, 122, 123, and 171, a plurality of thin film transistors (TFTs) T1, T2, T3, T4, T5, T6, and T7 connected to the signal lines 121, 122, 123, and 171, a storage capacitor Cst, an initialization voltage line 124, a driving voltage line 172, and an OLED.

Although FIG. 2 illustrates that the signal lines 121, 122, 123, and 171, the initialization voltage line 124, and the driving voltage line 172 are provided to every pixel PX, an exemplary embodiment of the present inventive concept is not limited thereto. For example, at least one of the signal lines 121, 122, 123, and 171 and/or the initialization voltage line 124 may be shared among adjacent pixels.

The TFTs may include a driving TFT T1, a switching TFT T2, a compensation TFT T3, a first initialization TFT T4, an operation control TFT T5, an emission control TFT T6, and a second initialization TFT T7.

The signal lines include a scan line 121 for transferring a scan signal Sn, a previous scan line 122 for transferring a previous scan signal Sn-1 to the first initialization TFT T4 and the second initialization TFT T7, an emission control line 123 for transferring an emission control signal En to the operation control TFT T5 and the emission control TFT T6, and a data line 171 crossing the scan line 121 and for transferring a data signal Dm. The driving voltage line 172 transfers a driving voltage ELVDD to the driving TFT T1, and the initialization voltage line 124 transfers an initialization voltage Vint for initializing the driving TFT T1 and a pixel electrode of the OLED.

A driving gate electrode G1 of the driving TFT T1 is connected to a first storage plate Cst1 of the storage capacitor Cst, a driving source electrode S1 of the driving TFT T1 is connected to the driving voltage line 172 through the operation control TFT T5, and a driving drain electrode D1 of the driving TFT T1 is electrically connected to a pixel electrode of the OLED through the emission control TFT T6, The driving TFT T1 receives a data signal Dm in response to a switching operation of the switching TFT T2 and supplies a driving current $I_{OLED}$ to the OLED.

A switching gate electrode G2 of the switching TFT T2 is connected to the scan line 121, a switching source electrode S2 of the switching TFT T2 is connected to the data line 171, and a switching drain electrode D2 of the switching TFT T2 is connected to the driving source electrode S1 of the driving TFT T1 and connected to the driving voltage line 172 through the operation control TFT T5. The switching TFT T2 is turned on in response to a scan signal Sn transferred via the scan line 121 and performs a switching operation to transfer a data signal Dm transferred via the data line 171 to the driving source electrode S1 of the driving TFT T1.

A compensation gate electrode G3 of the compensation TFT T3 is connected to the scan line 121, a compensation source electrode S3 of the compensation TFT T3 is connected to the driving drain electrode D1 of the driving TFT T1 and connected to the pixel electrode of the OLED through the emission control TFT T6, and a compensation drain electrode D3 of the compensation TFT T3 is connected to the first storage plate Cst1 of the storage capacitor Cst, a first initialization drain electrode D4 of the first initialization TFT T4, and the driving gate electrode G1 of the driving TFT T1. The compensation TFT T3 is turned on in response to a scan signal Sn transferred via the scan line 121 and diode-connects the driving TFT T1 by electrically connecting the driving gate electrode G1 of the driving TFT T1 to the driving drain electrode D1 of the driving TFT T1.

A first initialization gate electrode G4 of the first initialization TFT T4 is connected to the previous scan line 122, a first initialization source electrode S4 of the first initialization TFT T4 is connected to a second initialization drain electrode D7 of the second initialization TFT T7 and the initialization voltage line 124, and the first initialization drain electrode D4 of the first initialization TFT T4 is connected to the first storage plate Cst1 of the storage capacitor Cst, the compensation drain electrode D3 of the compensation TFT T3, and the driving gate electrode G1 of the driving TFT T1. The first initialization TFT T4 is turned on in response to a previous scan signal Sn-1 transferred via the previous scan line 122 and performs an initialization operation of initializing the voltage of the driving gate electrode G1 of the driving TFT T1 by transferring the initialization voltage Vint to the driving gate electrode G1 of the driving TFT T1.

An operation control gate electrode G5 of the operation control TFT T5 is connected to the emission control line 123, an operation control source electrode S5 of the operation control TFT T5 is connected to the driving voltage line 172, and an operation control drain electrode D5 of the operation control TFT T5 is connected to the driving source electrode S1 of the driving TFT T1 and the switching drain electrode D2 of the switching TFT T2.

An emission control gate electrode G6 of the emission control TFT T6 is connected to the emission control line 123, an emission control source electrode S6 of the emission control TFT T6 is connected to the driving drain electrode D1 of the driving TFT T1 and the compensation source electrode S3 of the compensation TFT T3, and an emission control drain electrode D6 of the emission control TFT T6 is connected to a second initialization source electrode S7 of the second initialization TFT T7 and the pixel electrode of the OLED.

The operation control TFT T5 and the emission control TFT T6 are simultaneously turned on in response to an emission control signal En transferred via the emission control line 123 and allow the driving voltage ELVDD to be applied to the OLED and the driving current $I_{OLED}$ to flow through the OLED.

A second initialization gate electrode G7 of the second initialization TFT T7 is connected to the previous scan line 122, the second initialization source electrode S7 of the second initialization TFT T7 is connected to the emission control drain electrode D6 of the emission control TFT T6 and the pixel electrode of the OLED, and the second initialization drain electrode D7 of the second initialization TFT T7 is connected to the first initialization source electrode S4 of the first initialization TFT T4 and the initialization voltage line 124. The second initialization TFT T7 is turned on in response to a previous scan signal Sn-1 transferred via the previous scan line 122 and initializes the pixel electrode of the OLED.

Although FIG. 2 illustrates that the first initialization TFT T4 and the second initialization TFT T7 are connected to the previous scan line 122, an exemplary embodiment of the present inventive concept is not limited thereto. For example, the first initialization TFT T4 may be connected to the previous scan line 122 and driven in response to a previous scan signal Sn-1, and the second initialization TFT T7 may be connected to a separate signal line (for example, a next scan line) and driven in response to a signal transferred via the separate signal line (for example, a next scan signal).

A second storage plate Cst2 of the storage capacitor Cst is connected to the driving voltage line 172, and the other electrode of the OLED is connected to a common voltage ELVSS. Therefore, the OLED may display an image by receiving the driving current $I_{OLED}$ from the driving TFT T1 and emitting light.

Although FIG. 2 illustrates that the compensation TFT T3 and the initialization TFT T4 include a dual gate electrode, an exemplary embodiment of the present inventive concept is not limited thereto. For example, the compensation TFT T3 and the initialization TFT T4 may include a single gate electrode. In addition, at least one of the other TFTs T1, T2, T5, T6, or T7 may have the dual gate electrode while the compensation TFT T3 and the initialization TFT T4 have a dual gate electrode. It is to be understood that various other modifications may be made. For example, at least one of the other TFTs T1, T2, T5, T6, or T7 may have the dual gate electrode while just the compensation TFT T3 has a dual gate electrode.

An operation of at least one of the pixels PX according to an exemplary embodiment of the present inventive concept is described below.

During an initialization period, when a previous scan signal Sn-1 is supplied via the previous scan line 122, the initialization TFT T4 is turned on in response to the previous scan signal Sn-1, and the driving TFT T1 is initialized by the initialization voltage Vint supplied from the initialization voltage line 124.

During a data programming period, when a scan signal Sn is supplied via the scan line 121, the switching TFT T2 and the compensation TFT T3 are turned on in response to a scan signal Sn. In this case, the driving TFT T1 is diode-connected and forward-biased by the turned-on compensation TFT T3.

Then, a compensation voltage, which is a data signal Dm supplied from the data line 171 subtracted by a threshold voltage Vth of the driving TFT T1, is applied to the driving gate electrode G1 of the driving TFT T1. The compensation voltage is Dm+Vth, where Vth is a negative value.

The driving voltage ELVDD and the compensation voltage Dm+Vth are applied to both ends of the storage capacitor Cst, and a charge corresponding to a voltage difference between the both ends is stored in the storage capacitor Cst.

During an emission period, the operation control TFT T5 and the emission control TFT T6 are turned on in response to an emission control signal En supplied from the emission control line 123. The driving current $I_{OLED}$ which results corresponds to a voltage difference between the voltage of the gate electrode G1 of the driving TFT T1 and the driving voltage ELVDD, and the driving current $I_{OLED}$ is supplied to the OLED via the emission control TFT T6.

Hereinafter, a structure of the pixel illustrated in FIG. 2 is described with reference to FIGS. 3 to 11.

Figure 3:
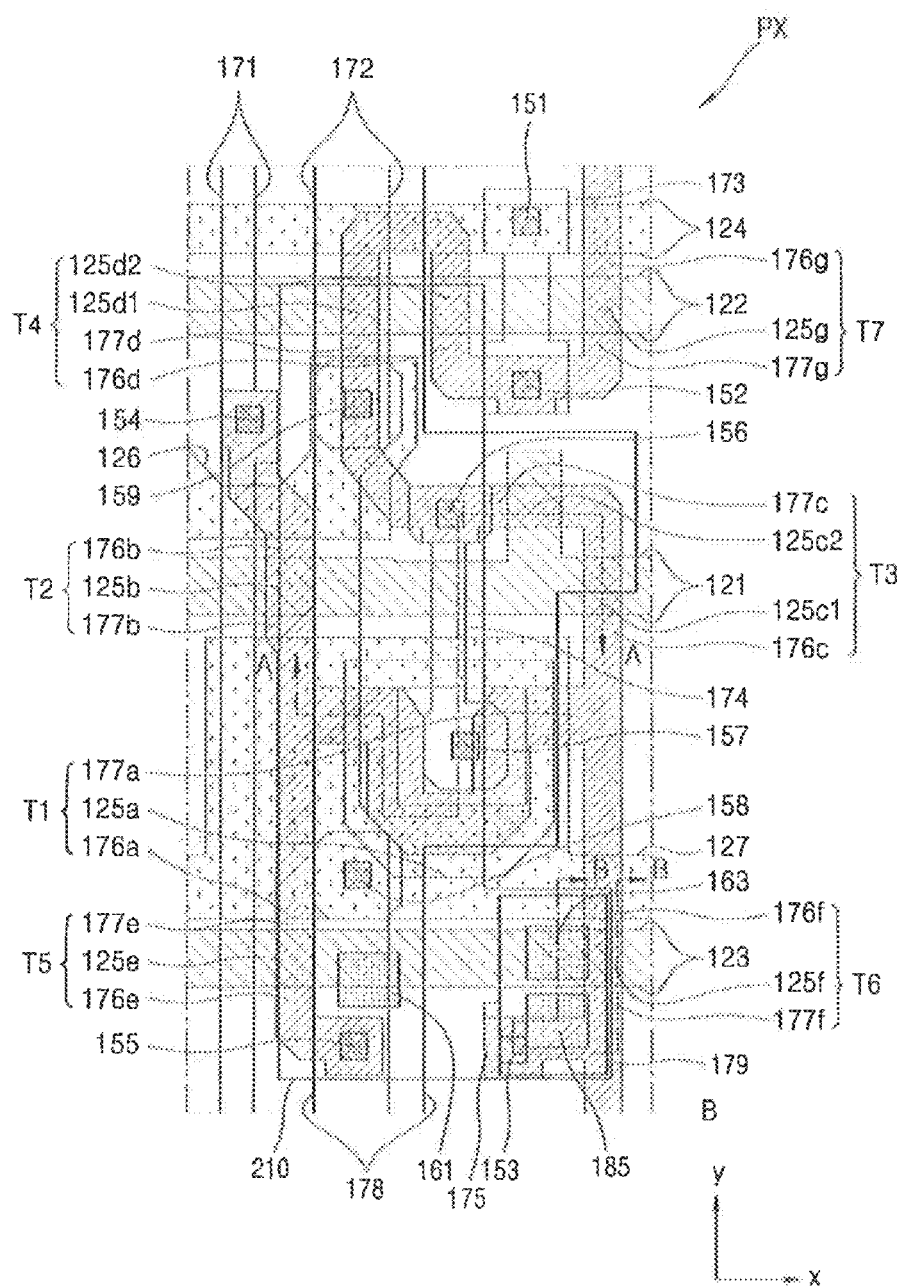
FIG. 3 is a layout illustrating locations of a plurality of thin film transistors, a storage capacitor, and a pixel electrode of a pixel of FIG. 2 according to an exemplary embodiment of the present inventive concept.

FIG. 3 is an arrangement view illustrating locations of a plurality of TFTs, a storage capacitor, and a pixel electrode of a pixel of FIG. 2, according to an exemplary embodiment of the present inventive concept. FIGS. 4 to 9 are arrangement views illustrating, for each layer, elements such as the plurality of TFT, the storage capacitor, and the pixel electrode illustrated in FIG. 3, according to an exemplary embodiment of the present inventive concept. FIG. 10 is a cross-sectional view taken along a line X-X of FIG. 3, according to an exemplary embodiment of the present inventive concept. FIG. 11 is a graph illustrating a driving current $I_{OLED}$ according to a comparison example and an exemplary embodiment of the present inventive concept.

Each of FIGS. 4 to 9 illustrates arrangement of a wiring, an electrode, a semiconductor layer, etc in the same layer. An insulating layer may be between the layers illustrated in FIGS. 4 to 9. For example, a first gate insulating layer 141 (see FIG. 10) is between a layer illustrated in FIG. 4 and a layer illustrated in FIG. 5, a second gate insulating layer 143 (see FIG. 10) is between the layer illustrated in FIG. 5 and a layer illustrated in FIG. 6, a first interlayer insulating layer 150 (see FIG. 10) is between the layer illustrated in FIG. 6 and a layer illustrated in FIG. 7, and a second interlayer insulating layer 160 (see FIG. 10) is between the layer illustrated in FIG. 7 and a layer illustrated in FIG. 8. In addition, a planarization insulating layer 180 (see FIG. 10) is between the layer illustrated in FIG. 8 and a layer illustrated in FIG. 9. The layers illustrated in FIGS. 4 to 9 may be electrically connected to each other via a contact hole in at least some of the above-described insulating layers.

Referring to FIG. 3, a pixel PX includes the scan line 121, the previous scan line 122, the emission control line 123, and the initialization voltage line 124 extending in a row direction (e.g., an x-direction). A scan signal Sn may be applied to the scan line 121, a previous scan signal Sn-1 may be applied to the previous scan line 122, an emission control signal En may be applied to the emission control line 123 and an initialization voltage Vint may be applied to the initialization voltage line 124. In addition, the pixel PX may include the data line 171 and the driving voltage line 172 extending in a column direction (e.g., a y-direction) crossing the scan line 121, the previous scan line 122, the emission control line 123, and the initialization voltage line 124. A data signal Dm may be applied to the data line 171 and a driving voltage ELVDD may be applied to the driving voltage line 172. In addition, the pixel PX includes a shielding layer 178 for preventing or reducing the occurrence of a parasitic capacitance and an off-current. In addition, the pixel PX includes the TFTs T1 to T7, the storage capacitor Cst, and an OLED (see FIG. 10) electrically connected thereto these. For convenience of description, the following description is made according to a stacking order of the elements (or layers) on a substrate.

Figure 4:
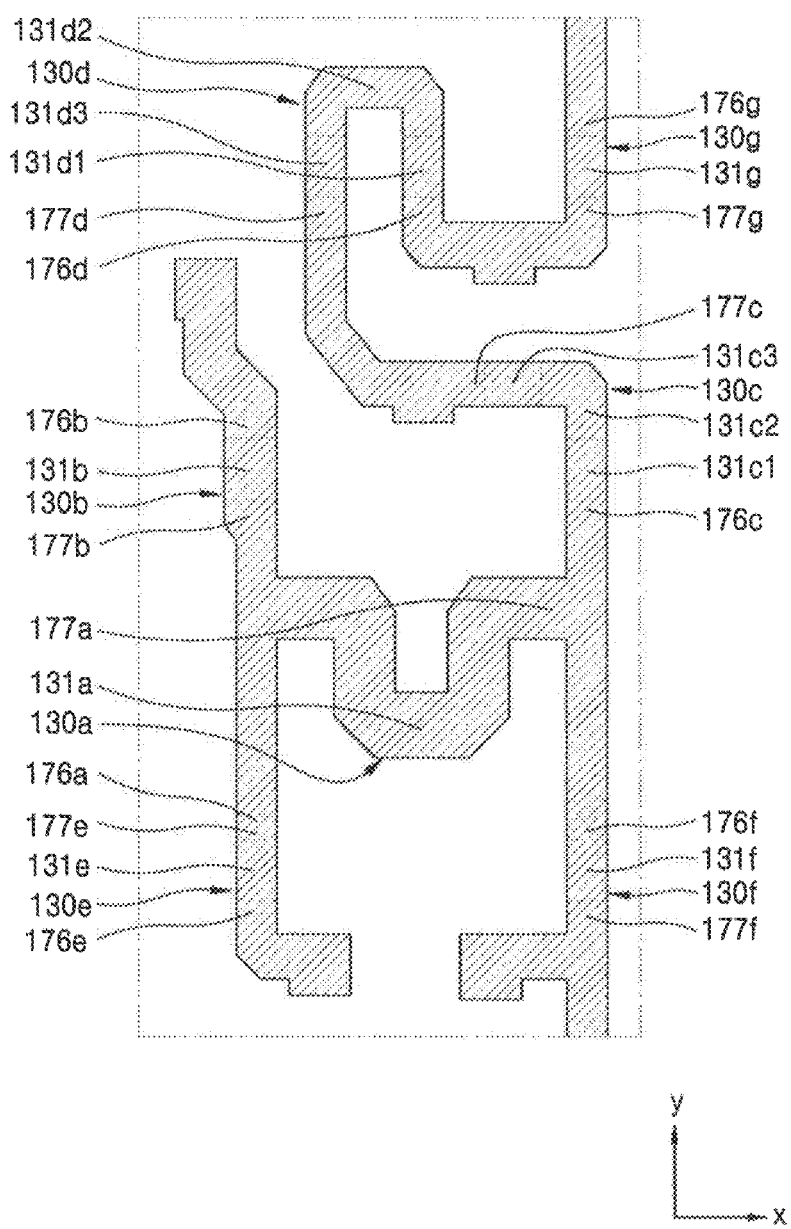
FIGS. 4, 5, 6, 7, 8 and 9 are layouts illustrating, for each layer, elements such as the plurality of thin film transistors, the storage capacitor, and the pixel electrode illustrated in FIG. 3 according to an exemplary embodiment of the present inventive concept.

Referring to FIGS. 3, 4, and 10, semiconductor layers 130a to 130g of the driving TFT T1, the switching TFT T2, the compensation TFT T3, the first initialization TFT 14, the operation control TFT T5, the emission control TFT T6, and the second initialization TFT T7 are in the same layer.

The semiconductor layers 130a to 130g are above a buffer layer 111 above the substrate 110. The substrate 110 may include a glass material, a metallic material, or a plastic material such as polyethylene terephthalate (PET), polyethylene naphthalate (PEN), polyimide (PI), etc. The buffer layer 111 may include an oxide layer such as SiOx and/or a nitride layer such as SiNx.

The driving semiconductor layer 130a of the driving TFT T1, the switching semiconductor layer 130b of the switching TFT T2, the compensation semiconductor layer 130c of the compensation TFT T3, the first initialization semiconductor layer 130d of the first initialization TFT T4, the operation control semiconductor layer 130e of the operation control TFT T5, the emission control semiconductor layer 130f of the emission control TFT T6, and the second initialization semiconductor layer 130g of the second initialization TFT T7 may be connected to each other and bent in various shapes.

The semiconductor layers 130a to 130g may include polycrystalline silicon. The semiconductor layers 130a to 130g may include amorphous silicon or an oxide semiconductor layer such as a G-I-Z-O layer [$(In_2O_3)a(Ga_2O_3)b(ZnO)c$ layer] (where a, b, c are real numbers meeting a condition of a≥0, b≥0, c≥0). For convenience of description, a case where the semiconductor layers 130a to 130g include polycrystalline silicon is described below.

The semiconductor layers 130a to 130g may include a channel region, and a source region and a drain region at both sides of the channel region. For example, the source region and the drain region may be doped with impurities, and the impurities may include N-type impurities or P-type impurities. The source region and the drain region respectively correspond to a source electrode and a drain electrode. Hereinafter, the terms "source region" and "drain region" may be used in place of the source electrode and the drain electrode.

The driving semiconductor layer 130a includes a driving channel region 131a, a driving source region 176a and a driving drain region 177a at both sides of the driving channel region 131a. The driving channel region 131a may be longer than the other channel regions 131b to 131g. For example, the semiconductor layer 130a has a shape that is bent a plurality of number of times such as the letter "S" or an omega. This configuration forms a long channel length inside a narrow space. Since the driving channel region 131a is long, the driving range of a gate voltage applied to a first electrode layer 125a, which is a driving gate electrode, widens and thus the grayscale of light emitted from an OLED may be more precisely controlled and consequently, display quality may increase.

The switching semiconductor layer 130b includes a switching channel region 131b, and a switching source region 176b and a switching drain region 177b at both sides of the switching channel region 131b. The switching drain region 177b is connected to the driving source region 176a.

The compensation semiconductor layer 130c includes compensation channel regions 131c1 and 131c3, and a compensation source region 176c and a compensation drain region 177c at both sides of the compensation channel regions 131c1 and 131c3. The compensation TFT T3 formed in the compensation semiconductor layer 130c is a dual TFT and includes the two compensation channel regions 131c1 and 131c3. A region 131c2 between the compensation channel regions 131c1 and 131c3 is a region doped with impurities and corresponds to a source region of one of the dual transistors and a drain region of the other of the dual transistors.

The first initialization semiconductor layer 130d includes first initialization channel regions 131d1 and 131d3, a first initialization source region 176d and a first initialization drain region 177d at both sides of the first initialization channel regions 131d1 and 131d3. The first initialization TFT T4 formed in the first initialization semiconductor layer 130d is a dual TFT and includes the two first initialization channel regions 131d1 and 131d3. A region 131d2 between the first initialization channel regions 131d1 and 131d3 is a region doped with impurities and corresponds to a source region of one of the dual transistors and a drain region of the other of the dual transistors.

The operation control semiconductor layer 130e includes an operation control channel region 131e, and an operation control source region 176e and an operation control drain region 177e at both sides of the operation control channel region 131e. The operation control drain region 177e may be connected to the driving source region 176a.

The emission control semiconductor layer 130f includes an emission control channel region 131f, and an emission control source region 176f and an emission control drain region 177f at both sides of the emission control channel region 131f. The emission control source region 176f may be connected to the driving drain region 177a.

The second initialization semiconductor layer 130g includes a second initialization channel region 131g, and a second initialization source region 176g and a second initialization drain region 177g at both sides of the second initialization channel region 131g.

The first gate insulating layer 141 is above the semiconductor layers 130a to 130g. The first gate insulating layer 141 may include an inorganic material including an oxide or a nitride. For example, the first gate insulating layer 141 may include $SiO_2$, SiNx, SiON, $Al_2O_3$, $TiO_2$, $Ta_2O_5$, $HfO_2$, or $ZnO_2$, etc.

Figure 5:
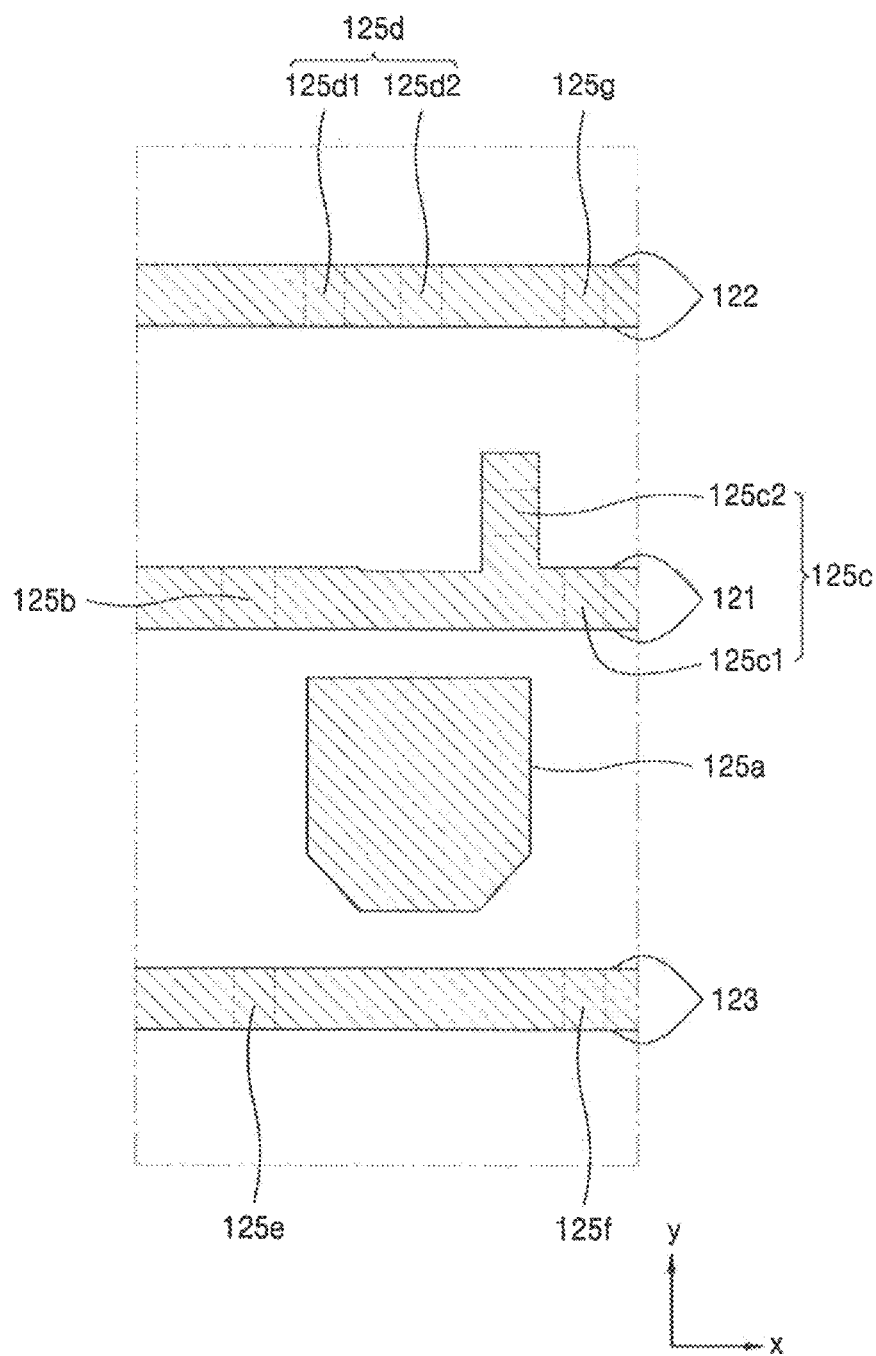

Referring to FIGS. 3, 5, 10, the scan line 121, the previous scan line 122, the emission control line 123, and the first electrode 125a are above the first gate insulating layer 141. The scan line 121, the previous scan line 122, the emission control line 123, and the first electrode 125a include the same material. For example, the scan line 121, the previous scan line 122, the emission control line 123, and the first electrode 125a may include Mo, Al, Cu, Ti, etc. and include a single layer or multiple layers.

A portion or a protruded portion of each of the scan line 121, the previous scan line 122, the emission control line 123, and the first electrode 125a corresponds to the gate electrodes of the TFTs T1 to T7.

For example, regions of the scan line 121 that overlap the switching channel region 131b and the compensation channel regions 131c1 and 131c3 respectively correspond to a switching gate electrode 125b and compensation gate electrodes 125c1 and 125c2. Regions of the previous scan line 122 that overlap the first initialization channel regions 131d1 and 131d3 and the second initialization channel region 131g respectively correspond to first initialization gate electrodes 125d1 and 125d2 and a second initialization gate electrode 125g. Regions of the emission control line 123 that overlap the operation control channel region 131e and the emission control channel region 131f respectively correspond to an operation control gate electrode 125e and an emission control gate electrode 125f.

The compensation gate electrodes 125c1 and 125c2 are dual gate electrodes and may prevent or reduce the occurrence of a leakage current.

A portion of the first electrode layer 125a that overlaps the driving channel region 131a corresponds to the driving gate electrode G1. The first electrode layer 125a is the driving gate electrode G1 and simultaneously serves as a first storage plate of the storage capacitor Cst. In other words, the driving gate electrode G1 and the first storage plate of the storage capacitor Cst are an integral body.

The second gate insulating layer 143 is above the scan line 121, the previous scan line 122, the emission control line 123, and the first electrode layer 125a. The second gate insulating layer 143 may include an inorganic material including an oxide or a nitride. For example, the second gate insulating layer 143 may include $SiO_2$, SiNx, SiON, $Al_2O_3$, $TiO_2$, $Ta_2O_5$, $HfO_2$, or $ZnO_2$, etc.

Figure 6:
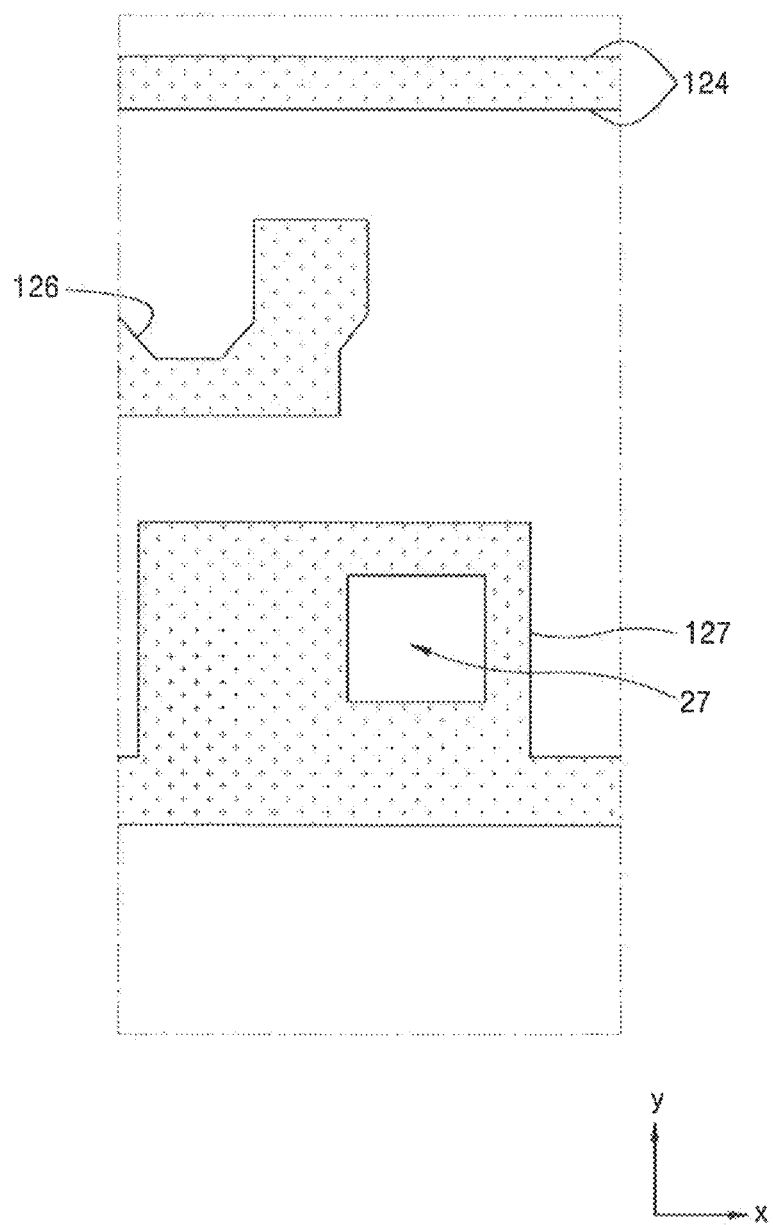

Referring to FIGS. 3, 6, and 10, the initialization voltage line 124, a plate 126, and a second electrode layer 127 are above the second gate insulating layer 143. The initialization voltage line 124, the plate 126, and the second electrode layer 127 include the same material. For example, the initialization voltage line 124, the plate 126, and the second electrode layer 127 may include Al, Cu, Ti, etc. and include a single layer or multiple layers.

The initialization voltage line 124 transfers an initialization voltage Vint for initializing the driving TFT T1 and a pixel electrode 210 (see FIG. 10). The initialization voltage line 124 is connected to the first and second initialization TFTs T4 and T7 via an initialization connection line 173.

The plate 126 is electrically connected to the driving voltage line 172 via a contact hole 159 as illustrated in FIG. 3, may cover the switching source region 176b, and cover the first initialization drain region 177d and/or the first initialization source region 176d. The plate 126 is electrically connected to the driving voltage line 172 to which a constant voltage is applied and may prevent the switching TFT T2 and the first and second initialization TFTs T4 and T7 from being influenced by neighboring electric signals. In other words, the plate 126 may serve an auxiliary shielding layer together with the shielding layer to increase an operation characteristic of a circuit of a pixel PX. This will be described is further detail later.

The second electrode layer 127 overlaps the first electrode layer 125a with the second gate insulating layer 143 disposed therebetween. The second electrode layer 127 corresponds to the second storage plate Cst2 of the storage capacitor Cst.

The second electrode layer 127 includes an opening 27 exposing the first electrode layer 125a. A portion of a node connection line 174 is electrically connected to the first electrode layer 125a via the opening 27.

The first interlayer insulating layer 150 is above the initialization voltage line 124, the plate 126, and the second electrode layer 127. The first interlayer insulating layer 150 may include $SiO_2$, SiNx, SiON, $Al_2O_3$, $TiO_2$, $Ta_2O_5$, $HfO_2$, or $ZnO_2$, etc.

Figure 7:
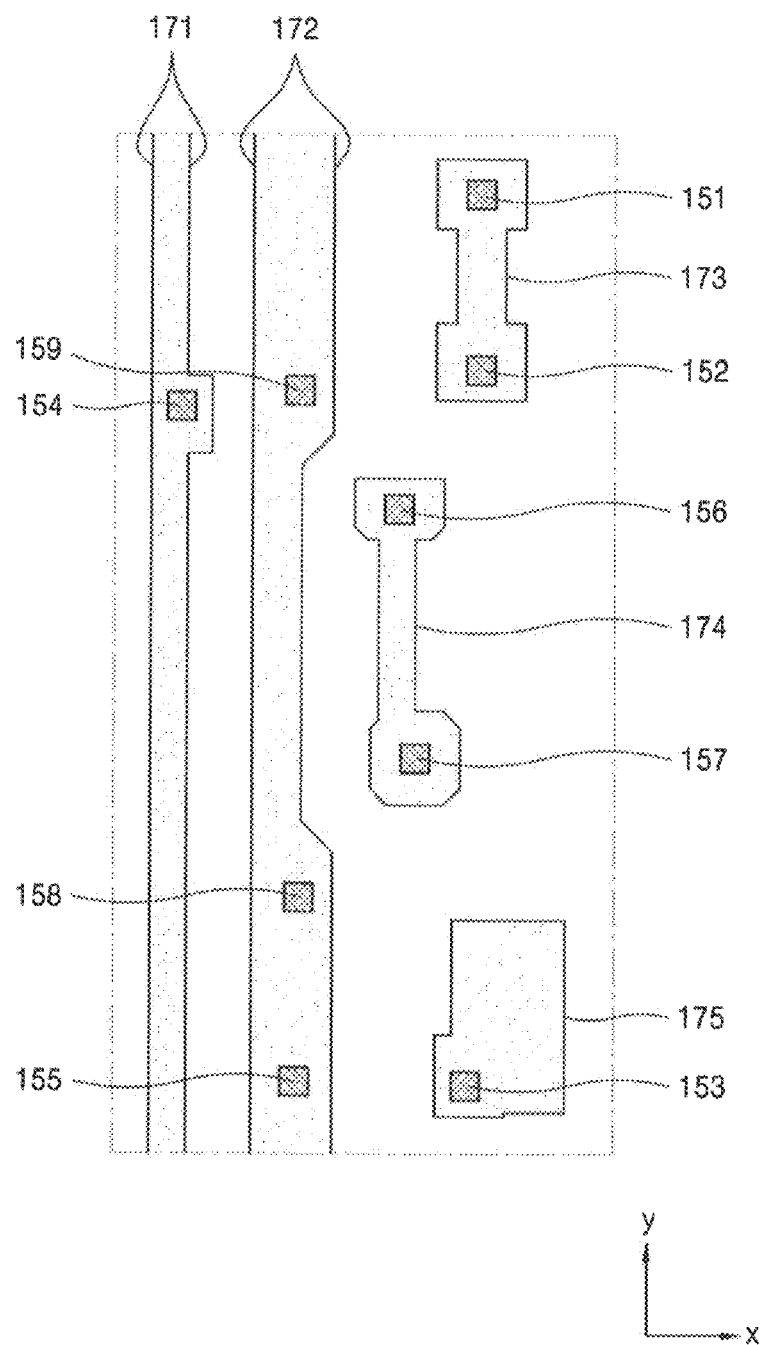

Referring to FIGS. 3, 7, and 10, the data line 171, the driving voltage line 172, the initialization connection line 173, the node connection line 174, and an intermediate connection layer 175 are above the first interlayer insulating layer 150. The data line 171, the driving voltage line 172, the initialization connection line 173, the node connection line 174, and the intermediate connection layer 175 include the same material. For example, the data line 171, the driving voltage line 172, the initialization connection line 173, the node connection line 174, and the intermediate connection layer 175 may include a conductive material including Mo, Al, Cu, Ti, etc. and include a single layer or multiple layers including the above material. For example, the data line 171, the driving voltage line 172, the initialization connection line 173, the node connection line 174, and the intermediate connection layer 175 may include a multi-layered structure including Ti/A/Ti.

The data line 171 may extend in the column direction (e.g., the y-direction) and may be connected to the switching source region 176b of the switching TFT T2 via a contact hole 154 passing through the first interlayer insulating layer 150.

The driving voltage line 172 extends in the column direction (e.g., the y-direction) and is connected to the operation control source region 176e of the operation control TFT T5 and the second electrode layer 127 via contact holes 155 and 158 in the first interlayer insulating layer 150. The driving voltage line 172 may be connected to the plate 126 via the contact hole 159 in the first interlayer insulating layer 150.

The initialization connection line 173 connects the initialization voltage line 124 to the first initialization source region 176d of the first initialization TFT T4 and the second initialization drain region 177g of the second initialization TFT T7 via contact holes 151 and 152 in the first interlayer insulating layer 150.

The node connection line 174 connects the first electrode layer 125a to a compensation drain region 177c of the compensation TFT T3 via contact holes 156 and 157. The island type first electrode layer 125a may be electrically connected to the compensation TFT T3 by the node connection line 174.

The intermediate connection layer 175 is connected to the emission control TFT T6 via a contact hole 153. For example, the intermediate connection layer 175 may be connected to the emission control drain region 177f of the emission control TFT T6.

The second interlayer insulating layer 160 is above the data line 171, the driving voltage line 172, the initialization connection line 173, the node connection line 174, and the intermediate connection layer 175. The second interlayer insulating layer 160 may include an inorganic insulating material such as $SiO_2$, SiNx, SiON, $Al_2O_3$, $TiO_2$, $Ta_2O_5$, $HfO_2$, or $ZnO_2$. The second interlayer insulating layer 160 may include a layer including the above-described inorganic insulating material and a layer including an organic insulating material.

Figure 8:
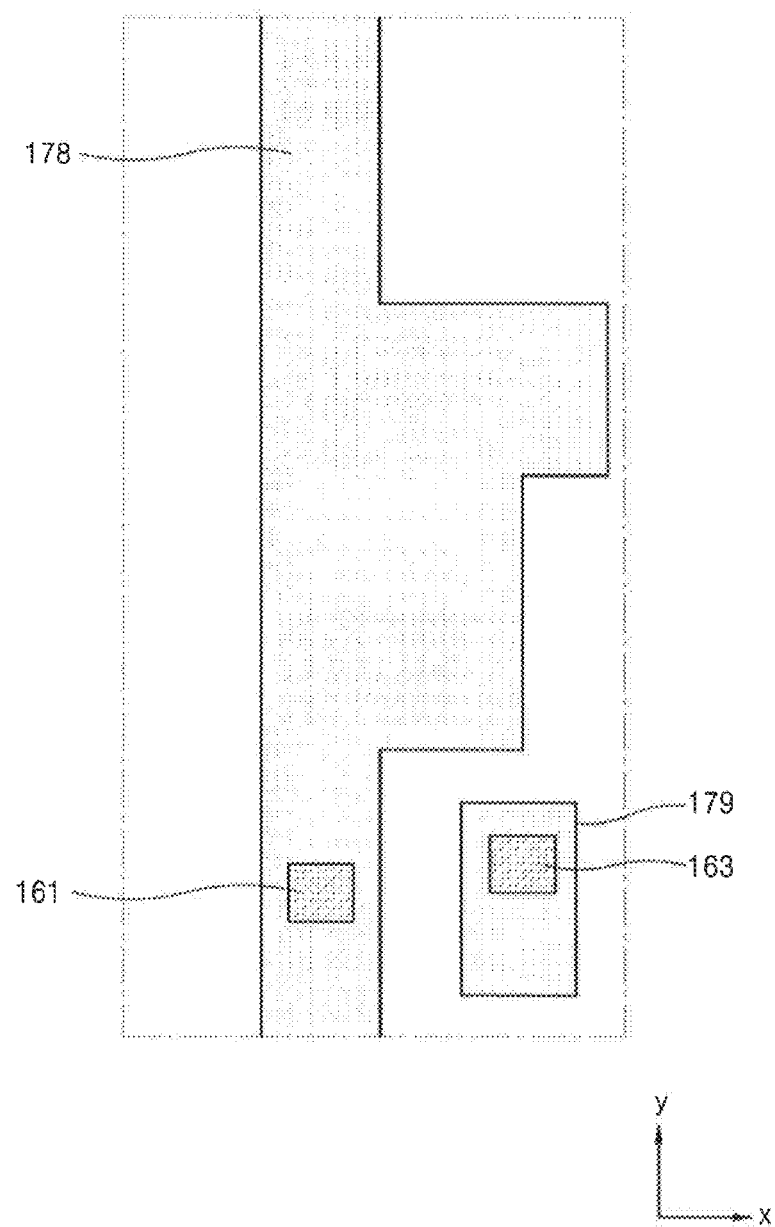

Referring to FIGS. 3, 8, and 10, the shielding layer 178 and an auxiliary connection layer 179 are above the second interlayer insulating layer 160. The shielding layer 178 and the auxiliary connection layer 179 include the same material. For example, the shielding layer 178 and the auxiliary connection layer 179 may include a conductive material including Mo, Al, Cu, Ti, etc. and include a single layer or multiple layers including the above material. For example, the shielding layer 178 and the auxiliary connection layer 179 may include a multi-layered structure including Ti/A/Ti.

The shielding layer 178 extends in the column direction (e.g., the y-direction) and a portion of the shielding layer 178 extends in the row direction (e.g., the x-direction), overlaps the first electrode layer 125a and the compensation TFT T3, and covers the first electrode layer 125a and the compensation TFT T3. For example, the shielding layer 178 may overlap a portion of the first electrode layer 125a, and overlap and cover the channel regions 131c1 and 131c3, the compensation gate electrodes 125c1 and 125c2, and the compensation drain electrode 177c of the compensation semiconductor layer 130c. The compensation source region 176c connected to the driving TFT T1 does not overlap the shielding layer 178.

The shielding layer 178 is connected to a wiring to which a constant voltage is applied. In an exemplary embodiment of the present inventive concept, the shielding layer 178 may be electrically connected to the driving voltage line 172 below the shielding layer 178 via a contact hole 161 in the second interlayer insulating layer 160. In other words, the shielding layer 178 may correspond to an upper driving voltage line, and the driving voltage line 172 may correspond to a lower driving voltage line. To implement a display device providing a high quality image, the occurrence of a voltage drop, etc. in the lower driving voltage line 172 should be prevented. However, since the lower driving voltage line 172 is in the same layer as the data line 171, the driving voltage line 172, the initialization connection line 173, the node connection line 174, and the intermediate connection layer 175 as illustrated in FIG. 7, there is a limit to increasing the area of the lower driving voltage line 172. However, according to the present embodiment, since the shielding layer 178, which is the upper driving voltage line, is electrically connected to the lower driving voltage line 172, a voltage drop may be prevented.

The shielding layer 178 overlaps the pixel electrode 210 and the first electrode layer 125a and prevents or reduces a parasitic capacitance between the pixel electrode 210 and the gate electrode G1 of the driving TFT T1.

As illustrated in FIG. 3, when the node connection line 174 is connected to the first electrode layer 125a, a parasitic capacitance between the pixel electrode 210 and the node connection line 174 corresponds to the parasitic capacitance between the pixel electrode 210 and the gate electrode G1 of the driving TFT T1. The shielding layer 178 may prevent or reduce the occurrence of the parasitic capacitance by entirely covering the node connection line 174.

If the shielding layer 178 does not exist, the driving current $I_{OLED}$ does not have a constant value and unintentionally increases in a saturation region due to the parasitic capacitance as illustrated in a comparison example curve of FIG. 11. To implement a display device providing a high quality image, the driving current $I_{OLED}$ should a constant value such as a REF curve of FIG. 11 in the saturation region. However, the driving current $I_{OLED}$ unintentionally increases in the saturation region due to the above-described parasitic capacitance, etc. and thus a current deviation $\Delta I$ is caused. In this case, the OLED emits light at brightness different from initially intended brightness. Furthermore, even when a current deviation $\Delta I$ of the same value occurs in every pixel, a degree of emission changes depending on the material of an emission layer 220 (see FIG. 10). Since emission layers 220 of pixels respectively emitting red, green, blue, and white light each include different materials, a degree of emission is different for each pixel even though a current deviation $\Delta I$ of the same value occurs, and thus a color deviation occurs.

However, according to the present embodiment, since the occurrence of the parasitic capacitance is prevented or reduced by the shielding layer 178, an increase of the driving current $I_{OLED}$ in the saturation region is suppressed as illustrated in an embodiment curve of FIG. 11. Therefore, since the emission of the OLED at a brightness different from an initially intended brightness is prevented and a color deviation is reduced, deterioration of image quality provided by the display device may be prevented.

The shielding layer 178 may prevent or reduce the occurrence of an off-current due to external light by covering the compensation TFT T3 diode-connecting the driving TFT T1. For example, the shielding layer 178 may cover the compensation drain region 177c and cover a region exposed between the compensation gate electrodes 125c1 and 125c2, which are dual gates, in other words, the region 131c2 between the compensation channel regions 131c1 and 131c3.

If the shielding layer 178 does not exist, an off-current due to an external light increases and reddish, bluish, or greenish color may result depending on the material of the emission layer 220. However, according to the present embodiment, since the shielding layer 178 covers the compensation drain region 177c and the region 131c2 exposed between the compensation gate electrodes 125c1 and 125c2, an influence of the off-current by the external light may reduce. In addition, since the shielding layer 178 covers the region 131c2 of the compensation semiconductor layer 130c, an influence of other neighboring electric signals, for example, signals transmitted via the data line 171 of an adjacent pixel PX, on the compensation TFT T3 may be minimized. Therefore, the display device may provide a high quality image.

The auxiliary connection layer 179 is connected to the intermediate connection layer 175 via a contact hole 163, and the planarization insulating layer 180 is above the shielding layer 178 and the auxiliary connection layer 179. The planarization insulating layer 180 may include an organic material such as benzocyclobutene (BCB), polyimide, or hexamethyldisiloxane (HMDSO).

Figure 9:
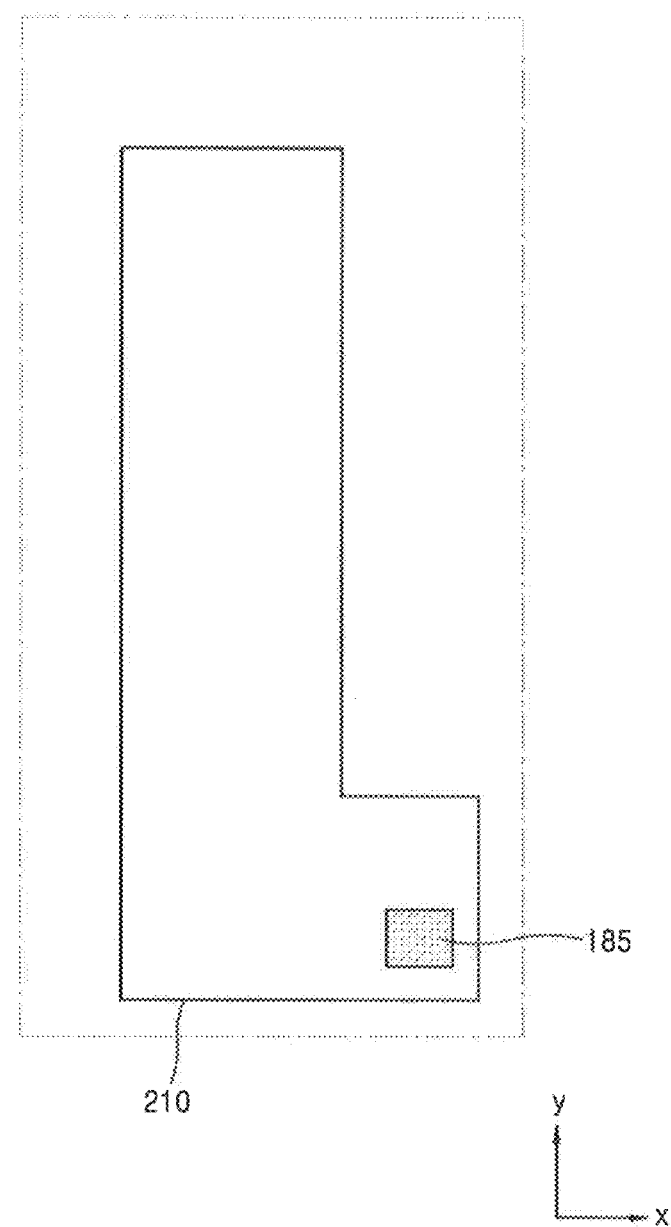
Figure 10:
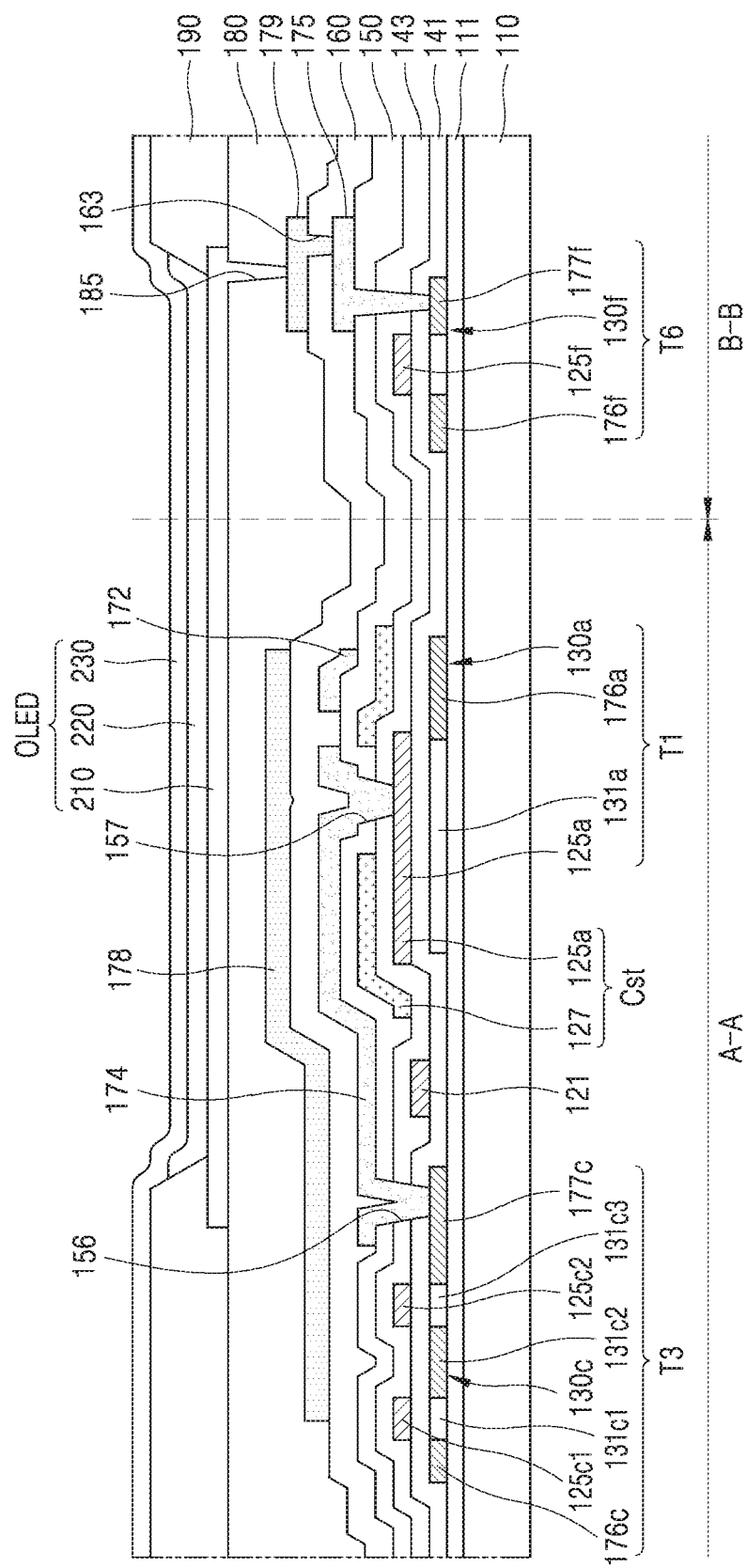
FIG. 10 is a cross-sectional view of the pixel taken along a line X-X of FIG. 3 according to an exemplary embodiment of the present inventive concept.
Figure 11:
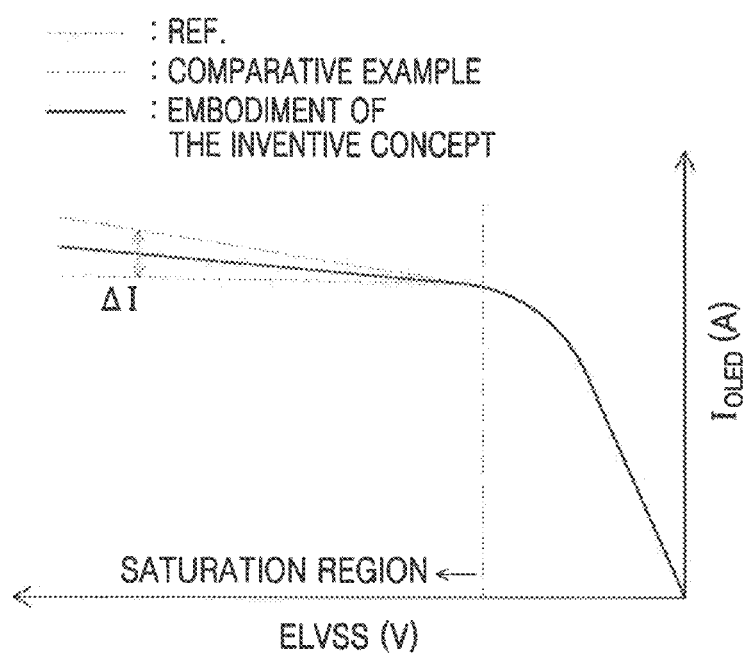
FIG. 11 illustrates a graph of a driving current according to a comparative example and an exemplary embodiment of the present inventive concept.

Referring to FIGS. 3, 9, 10, the pixel electrode 210 is above the planarization insulating layer 180. The pixel electrode 210 is connected to the auxiliary connection layer 179 via a contact hole 185 in the planarization insulating layer 180. The pixel electrode 210 is connected to the emission control drain region 177f of the emission control TFT T6 by the auxiliary connection layer 179 and the intermediate connection layer 175.

The pixel electrode 210 may be a reflective electrode. For example, the pixel electrode 210 may include a reflective layer including Ag, Mg, Al, Pt, Pd, Au, Ni, Nd, Ir, Cr, or a compound thereof, and a transparent or semi-transparent electrode layer above the reflective layer. The transparent or semi-transparent electrode layer may include indium tin oxide (ITO), indium zinc oxide (IZO), zinc oxide (ZnO), $In_2O_3$, indium gallium oxide (IGO), or aluminum zinc oxide (AZO).

Referring to FIG. 10, a pixel-defining layer 190 exposing the pixel electrode 210 is above the pixel electrode 210. The pixel-defining layer 190 may include an organic insulating material including polyimide, polyamide, an acryl resin, benzocyclobutene, or a phenol resin.

The emission layer 220 is above the pixel electrode 210 exposed by the pixel-defining layer 190. The emission layer 220 may include an organic material including a fluorescent or phosphorescent material for emitting red, green, blue, or white light. The emission layer 220 may include a low molecular organic material or a polymer organic material.

A functional layer such as a hole transport layer (HTL), a hole injection layer (HIL), an electron transport layer (ETL), and an electron injection layer (EIL) may be selectively disposed above and/or below the emission layer 220.

The opposite electrode 230 may be a transmissive electrode. For example, the opposite electrode 230 may be a transparent or a semi-transparent electrode layer and may include a metallic thin film having a small work function and including Li, Ca, LiF/Ca, LiF/Al, Ag, Mg, or a compound thereof. In addition, a transparent conductive oxide (TCO) layer such as ITO, IZO, ZnO or $In_2O_3$ may be further above the metallic thin film.

Although the case where the shielding layer 178 is the driving voltage line has been described above, exemplary embodiments of the present inventive concept are not limited thereto. For example, to prevent or reduce the occurrence of a parasitic capacitance between the pixel electrode 210 and the gate electrode G1 of the driving TFT T1 and/or the node connection line 174, the shielding layer 178 may be connected to the initialization voltage line 124, and the initialization voltage Vint, which is a constant voltage, may be applied to the shielding layer 178. Alternatively, the voltage ELVSS, which is a constant voltage, may be applied to the shielding layer 178.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

What is claimed is:

1. A display device, comprising:
a scan line extending in a first direction;
a data line extending in a second direction;
a first transistor comprising a first semiconductor layer electrically connected to the data line, the first semiconductor layer including a first channel region overlapped by a part of the scan line;
a second transistor comprising a second semiconductor layer and a gate electrode layer, wherein the gate electrode overlaps a second channel region of the second semiconductor layer;
a light-emitting diode electrically connected to the second transistor and including a first electrode, an emission layer, and a second electrode;
a capacitor overlapping the second transistor, the capacitor including a lower electrode and an upper electrode with a first insulation layer therebetween; and
a voltage line electrically connected to the capacitor, wherein the data line is on a second insulation layer which is different from a third insulation layer on which the voltage line is disposed.

2. The display device of claim 1, wherein the second insulation layer is between the first insulation layer and the third insulation layer.

3. The display device of claim 2, wherein the upper electrode of the capacitor is between the first insulation layer and the second insulation layer.

4. The display device of claim 1, further comprising:
a conductive line overlapped by the voltage line.

5. The display device of claim 4, wherein the voltage line and the conductive line are connected each other via a contact hole of the third insulation layer.

6. The display device of claim 1, wherein the voltage line comprises a same material as the data line.

7. The display device of claim 1, wherein:
the second channel region is bent under the gate electrode of the second transistor, and
the gate electrode of the second transistor comprises the lower electrode of the capacitor.

8. The display device of claim 1, further comprising:
a third transistor electrically connected to the second transistor, the third transistor comprising a third semiconductor layer and a gate electrode, wherein the gate electrode of the third transistor overlaps a third channel region of the third semiconductor layer,
wherein the light-emitting diode is electrically connected to the third semiconductor layer.

9. The display device of claim 8, further comprising:
a first conductor electrically connected to the third semiconductor layer;
a second conductor connected to the first conductor, the third insulation layer disposed between the first conductor and the second conductor; and
a fourth insulation layer on the second conductor.

10. The display device of claim 9, wherein:
the second conductor is connected to the first conductor via a first contact hole in the third insulation layer,
the first electrode of the light-emitting diode is connected to the second conductor via a second contact hole in the fourth insulation layer, and
the first contact hole and the second contact hole are spaced apart from each other in a plan view.

11. A display device, comprising:
a scan line extending in a first direction;
a data line extending in a second direction;
a first transistor comprising a first semiconductor layer electrically connected to the data line, the first semiconductor layer including a first channel region overlapped by a part of the scan line;
a second transistor comprising, a second semiconductor layer and a gate electrode layer, wherein the gate electrode overlaps a second channel region of the second semiconductor layer;
a capacitor overlapping the second transistor, the capacitor including a lower electrode and an upper electrode with a first insulation layer therebetween;
a voltage line electrically connected to the capacitor;
a third transistor comprising a third semiconductor layer and a gate electrode, wherein the gate electrode of the third transistor overlaps a third channel region of the third semiconductor layer;
a first conductor electrically connected to a source region or a drain region of the third semiconductor layer;
a second conductor connected to the first conductor via a first contact hole of a second insulation layer; and
a light-emitting diode including a first electrode, an emission layer, and a second electrode, wherein the first electrode is connected to the second conductor via a second contact hole in a third insulation layer, and wherein the first contact hole and the second contact hole are spaced apart from each other in a plan view.

12. The display device of claim 11, wherein:
the voltage line and the second conductor are over the second insulation layer, and the data line and the first conductor are under the second insulation layer.

13. The display device of claim 11, wherein the voltage line comprises a same material as the data line.

14. The display device of claim 11, wherein the second channel region is bent under the Rate electrode of the second transistor.

15. The display device of claim 11, wherein the gate electrode of the second transistor comprises the lower electrode of the capacitor.

16. The display device of claim 11, further comprising a conductive line overlapped by the voltage line.

17. The display device of claim 16, wherein the voltage line and the conductive line are connected each other via a contact hole in the second insulation layer.

18. A display device, comprising:
a scan line extending in a first direction;
a data line extending in a second direction;
a first transistor comprising a first semiconductor layer electrically connected to the data line, the first semiconductor layer including a first channel region overlapped by a part of the scan line;
a second transistor comprising a second semiconductor layer and a gate electrode layer, wherein the gate electrode overlaps a second channel region of the second semiconductor layer;
a capacitor overlapping, the second transistor, the capacitor including a lower electrode and an upper electrode with a first insulation layer therebetween;
a voltage line electrically connected to the capacitor;
a third transistor comprising a third semiconductor layer and a gate electrode, wherein the gate electrode of the third transistor overlaps a third channel region of the third semiconductor layer;
a first conductor electrically connected to a source region or a drain region of the third semiconductor layer;
a second conductor connected to the first conductor via a first contact hole of a second insulation layer, and
a light-emitting diode including a first electrode, an emission layer, and a second electrode, wherein the first electrode is connected to the second conductor via a second contact hole in a third insulation layer,
wherein, in a plan view, a center of the first contact hole and a center the second contact hole are spaced apart from each other.

19. The display device of claim 18, wherein the voltage line comprises a same material as the data line.

20. The display device of claim 19, further comprising:
a conductive line overlapped by the voltage line and electrically connected to the voltage line.

* * * * *